(12) United States Patent
Hart et al.

(10) Patent No.: US 6,747,495 B1
(45) Date of Patent: Jun. 8, 2004

(54) LOW JITTER ANALOG-DIGITAL LOCKER LOOP WITH LOCK DETECTION CIRCUIT

(75) Inventors: Siegfried Hart, Kleinhoehenrain (DE); Heinz Werker, Huglfing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/889,260

(22) PCT Filed: Jan. 3, 2000

(86) PCT No.: PCT/DE00/00021
§ 371 (c)(1),
(2), (4) Date: Jun. 3, 2002

(87) PCT Pub. No.: WO00/43849
PCT Pub. Date: Jul. 27, 2000

(30) Foreign Application Priority Data
Jan. 21, 1999 (DE) .......................... 199 02 335

(51) Int. Cl.⁷ ................................................. H03L 7/06
(52) U.S. Cl. ................. 327/156; 327/160; 331/DIG. 2; 375/376
(58) Field of Search ................................. 327/155, 156, 327/159, 160, 162, 151, 147, 150, 105, 107; 375/371–376; 331/1 A, DIG. 2

(56) References Cited

U.S. PATENT DOCUMENTS

| | | | |
|---|---|---|---|
| 4,490,688 A | * 12/1984 | Borras et al. ................ | 331/1 A |
| 4,686,560 A | * 8/1987 | Balaban et al. .............. | 348/508 |
| 4,864,253 A | 9/1989 | Zwack ........................ | 331/1 A |
| 5,057,793 A | * 10/1991 | Cowley et al. .............. | 331/1 A |
| 5,487,093 A | 1/1996 | Adresen et al. .............. | 375/376 |
| 5,546,433 A | 8/1996 | Tran et al. ................... | 375/376 |
| 6,028,460 A | * 2/2000 | McCollum et al. .......... | 327/105 |

FOREIGN PATENT DOCUMENTS

JP 2-149018 6/1990

OTHER PUBLICATIONS

Mihai Banu; "Design of High–Speed Wide–Band Mos Oscillators for Monolithic Phase–Locked Loop Applications"; Proceedings of the International symposium on Circuits and Systems, US, New York, IEEE, Jun. 1998.

* cited by examiner

Primary Examiner—Minh Nguyen
(74) Attorney, Agent, or Firm—Welsh & Katz, Ltd.

(57) ABSTRACT

A digital phase detector compares the output clock signal of the oscillator with the reference clock signal, an analog phase detector, and a lock detection circuit connected to a digital phase detector and an analog phase detector for avoiding a phase quantization error. The lock detection circuit activates the analog phase detector to run simultaneously with a digital phase detector if the phase error is zero. The activated analog phase detector regulates the output clock signal of the digitally controllable oscillator in a continuously variable manner until the respective clock signal edges of the output clock signal and the reference clock signal are fully synchronous. The lock detection circuit deactivates the analog phase detector and continuously checks and regulates the digital phase detector until the phase error between the output clock signal and the reference clock signal is zero.

2 Claims, 5 Drawing Sheets

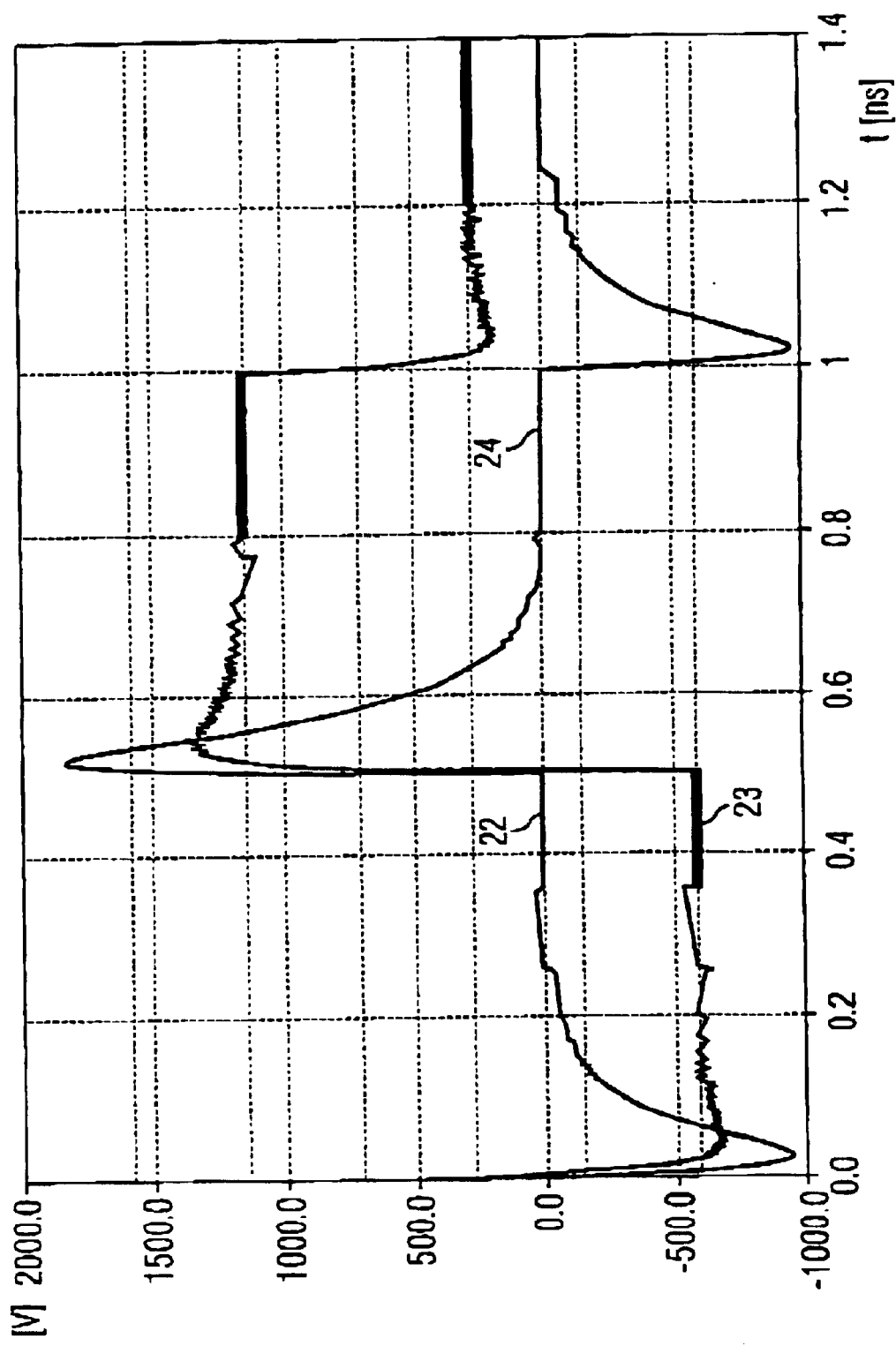

LOW JITTER ANALOG-DIGITAL LOCKER LOOP WITH LOCK DETECTION CIRCUIT

FIELD OF THE INVENTION

The invention relates to an electronic phase-locked loop (PLL) for jitter-attenuated clock multiplication, in particular as part of an integrated circuit (IC) for integrated services communications networks (ISDN), data communication or networks.

BACKGROUND OF THE INVENTION

In the prior art, it is customary for the frequency to be set in such a way that it corresponds to a reference frequency. For this purpose, analog circuit arrangements have a controllable oscillator whose output signal is compared with the reference frequency in a phase detector. The output signal of the analog phase detector in turn sets the frequency of the controllable oscillator via a regulated system. An analog circuit arrangement of this type is generally more difficult to integrate than a digital circuit arrangement and usually requires additional components. The regulation is fairly accurate.

A digital implementation of a phase-locked loop is simple to integrate, affords the possibilities of rapid conversion to new technologies by using synthesis tools, and is relatively independent of fluctuations in the process for fabricating the integrated circuit (IC). The regulating accuracy can be achieved right down to the lowest discretization level for the digital representation of the numerical values.

One disadvantage of the digital PLL that has been customary heretofore is that, on account of inherent quantization, the PLL undergoes transition into a so-called "limit cycle" and henceforth alternates between a phase error of +1, 0 and −1; as a result, the high-frequency clock signal generated has a slow but unavoidable variance, called "jitter".

In the publication relating to the conference "IEEE 1988 CUSTOM INTEGRATED CIRCUITS CONFERENCE", CH2584-1/88/0000-0051, pages 9.5.1 to 9.5.3, a description is given, by Rockwell International Semiconductor Products Division, i.e. by the authors Shi & al., of an electronic circuit arrangement designated "Jitter Attenuation Phase Locked Loop using switched capacitor controlled crystal oscillator", which is intended to effect jitter attenuation.

A phase-locked loop (PLL) is used which attenuates jitter amplitudes of up to 30 unit intervals (UI) at a bandwidth of less than 2 Hz. The PLL has a crystal oscillator which is controlled in three frequencies by switched capacitors, and a down-counting sequential logic phase/frequency detector. By dynamic variation of the charging capacitance, the frequency of the oscillator is adjusted in accordance with the operating cycle of the control signal. Digital CMOS technology is used in this case. This technology does not require a complicated analog circuit. The digital control logic is simple.

DE-A1-39 20 008 describes an electronic phase-locked loop (PLL) appertaining to communications and data technology which has a phase comparator and an oscillator controlled by means of a switching matrix designed as capacitance or inductance matrix. The frequency of the oscillator can be set precisely, over the accuracy values that are limited by the tolerance limits of the switching matrix, by virtue of the fact that at least one switching element, preferably the least significant one, of the switching matrix is driven by a pulse length modulator. A first output signal burst formed by a microprocessor is fed to the switching matrix, and at least one further output signal burst is applied to the pulse length modulator. The pulse length modulator is clocked by a clock signal derived from an output signal of the voltage-controlled oscillator, said clock signal also driving a switch for driving the switching element.

Consequently, just like in the PLL according to the IEEE Conference publication discussed above, what is present is digital, in this case additionally refined, stepwise control of the oscillator which, moreover, certainly helps to reduce the so-called jitter, even though such "Jitter" is not mentioned per se.

SUMMARY OF THE INVENTION

Against the background of this prior art, the invention is based on the object of attenuating, in an electronic co phase-locked loop (PLL) of digital design, even the jitter of the lowest digital discretization level.

The invention provides a digital phase-locked loop—which can be synthesized from standard cells—with the assistance of an analog phase detector and a circuit for lock detection, whereby the disadvantages hitherto of the purely digital solution are overcome.

The invention is explained in more detail below in an exemplary embodiment and with reference to the drawings.

CONCISE DESCRIPTION OF THE DRAWINGS

Figure 4:
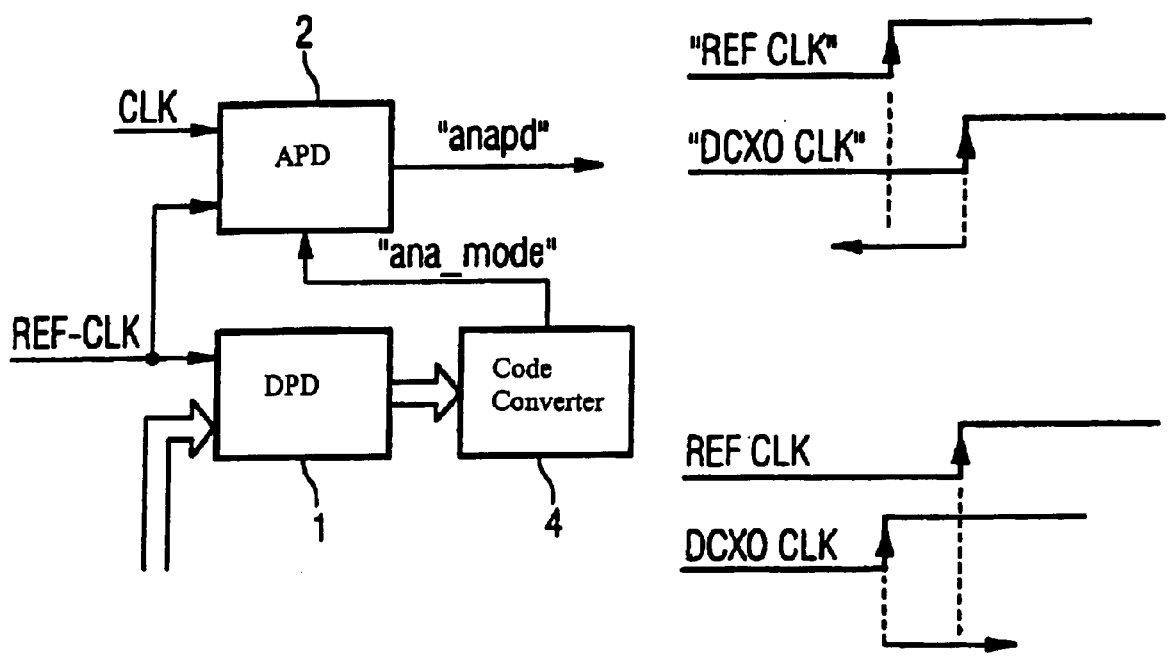

FIG. 4 diagrammatically shows the operation of the analog phase detector APD in the PLL according to the invention; and FIG. 5 shows an illustration of the regulation according to the invention using a simulation example.

DETAILED DESCRIPTION OF THE DRAWINGS

Figure 1:
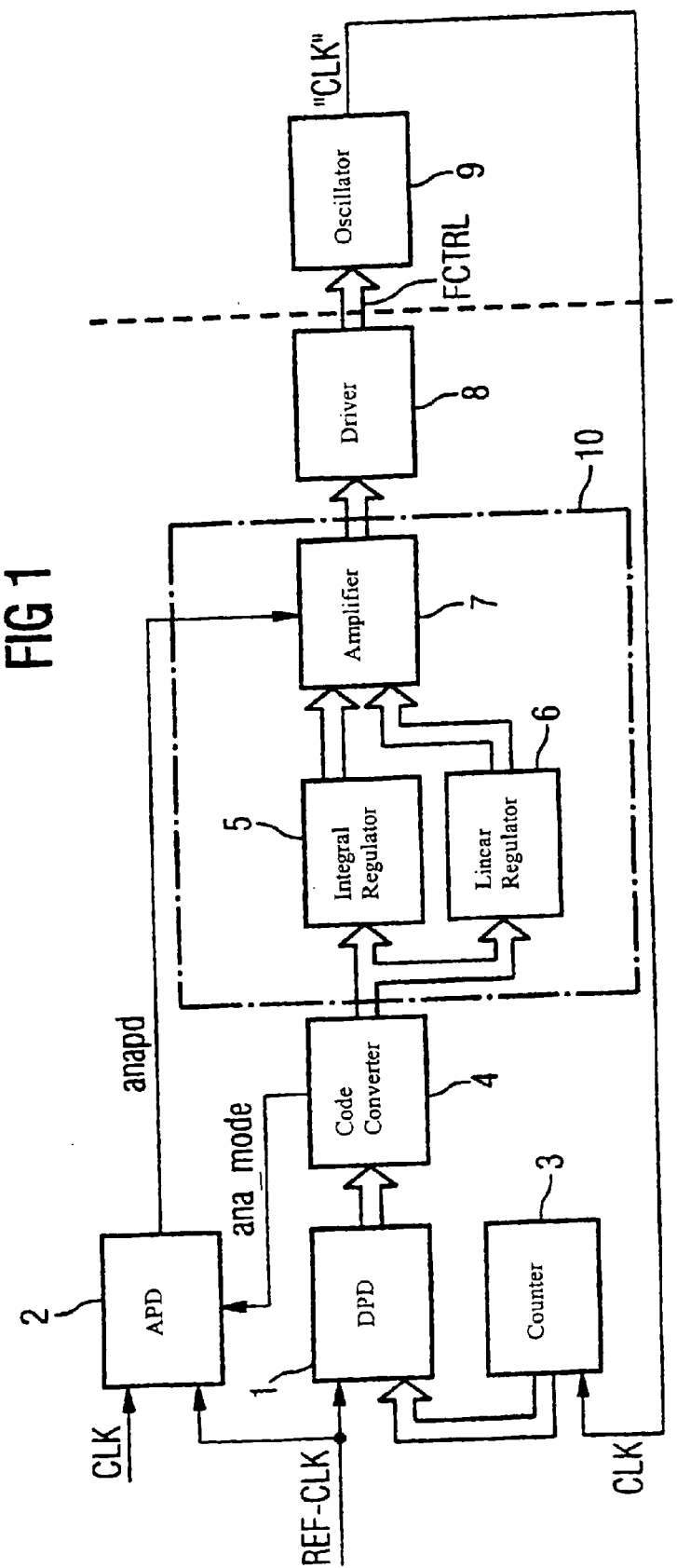
FIG. 1 shows a phase-locked loop PLL with digital regulation and with an additional analog phase detector APD being incorporated according to the invention.

FIG. 1 shows the block diagram of the phase-locked loop PLL configured according to the invention, comprising two phase detectors, namely the digital DPD 1 and the additional analog phase detector APD 2, and also a code converter 4, which undertakes, inter alia, the lock detection, a PI filter or PI regulator 10, which comprises, in a known manner, an integral regulation 5 and also a linear regulation 6, and also an addition and amplifier stage 7, and a driver DCXO-control 8 for the oscillator, a digitally controllable crystal. oscillator DCXO 9, and also a coupter 3. In the example, the counter 3 operates like a divider with the divisor 2048, an exemplary 8 kHz clock frequency resulting from the division of 16.384 MHz by 2048, which are fed into the DPD 1 in addition to a reference frequency of 8 kHz.

Figure 2:
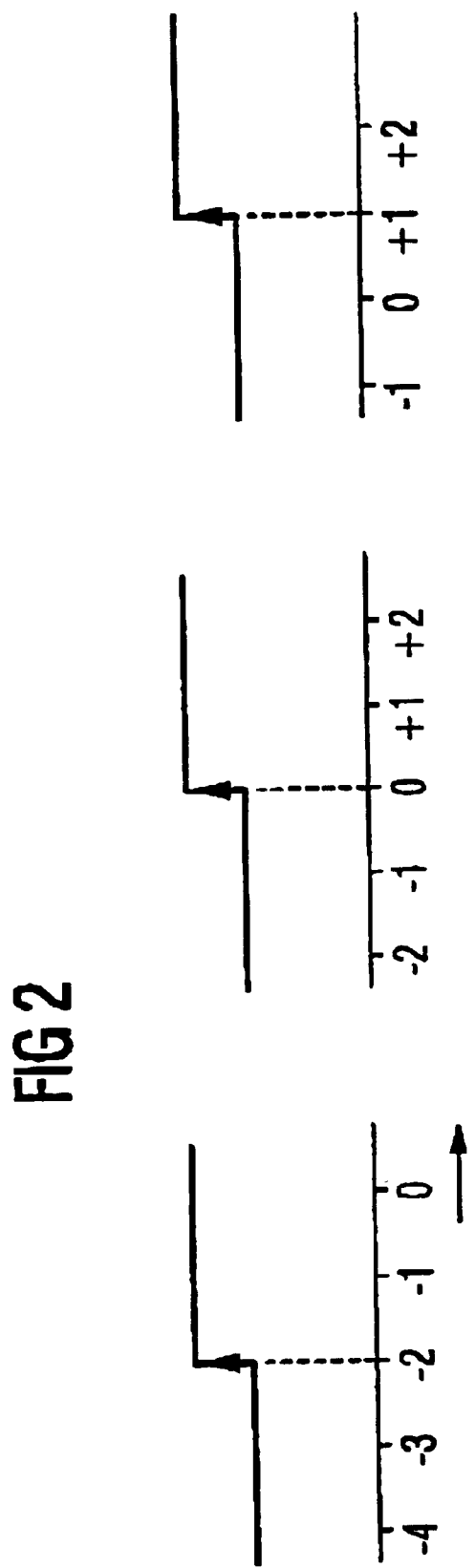
FIG. 2 illustrates the profile of the driving of the oscillator DCXO from the drive circuit DCXO-control within a conventional digital PLL.
Figure 3:
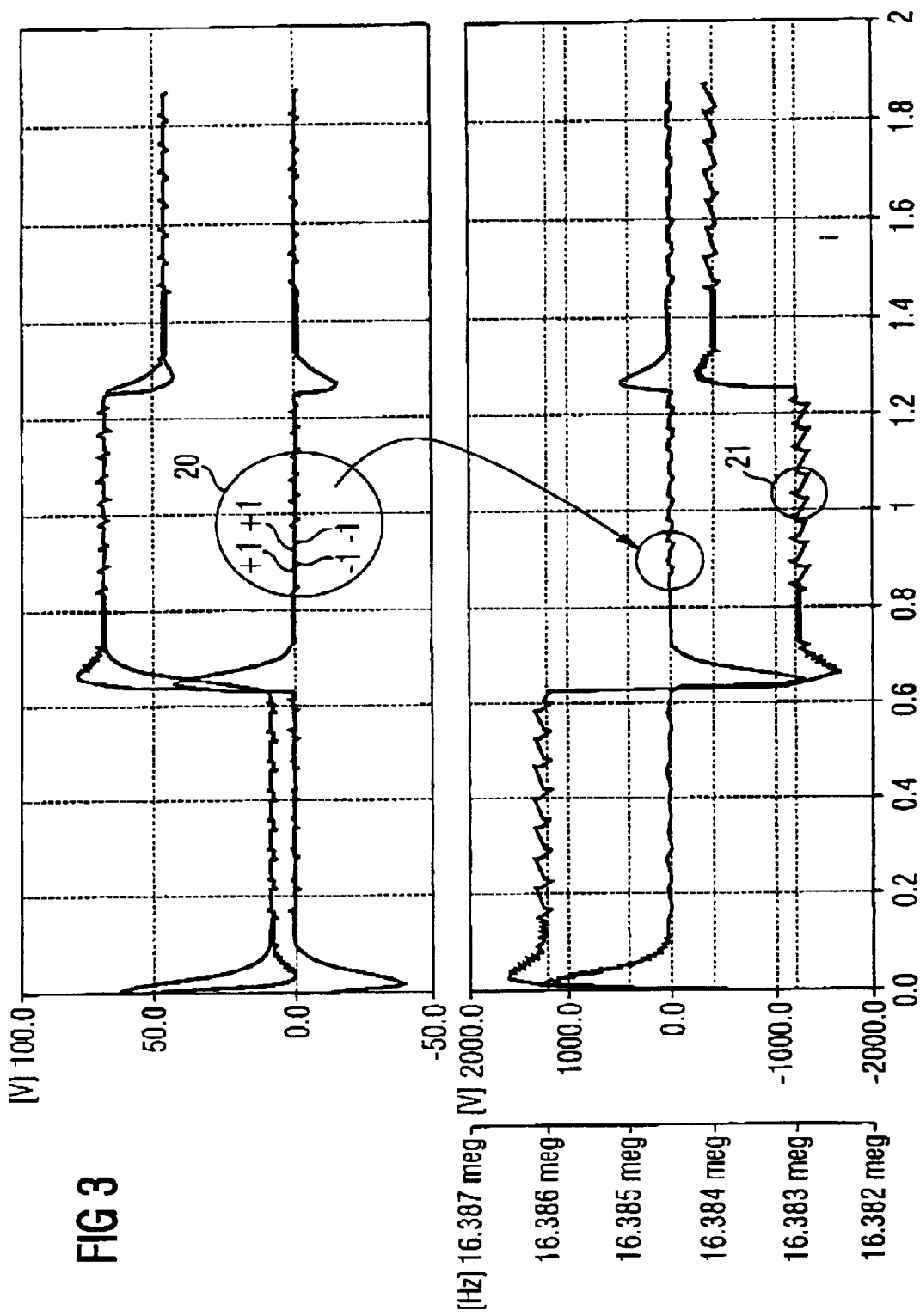
FIG. 3 shows the jitter in the output signal of the phase detector DPD in a conventional digital PLL.

The method of operation of the digital PLL is as follows and is illustrated in FIGS. 2 and 3, the reference clock signal REF-CLK being illustrated in relation to the content of the counter 3:

Upon each rising edge of the reference clock signal (REF-CLK), the present value of the counter 3 is stored in the phase detector 1 (see FIG. 2) and is applied to the PI filter 5, 6 via the code converter 4. In this case, the counter reading is a measure of the phase error and can be positive or negative. This quantized phase error is fed via the PI filter 5, 6 to he oscillator 9, which is thereby either slowed down or accelerated. In other words, in the left-hand part of FIG. 2, the oscillator 9 must be accelerated, while it is synchronous with the reverence clock signal in the middle part. In the right-hand part of FIG. 2, the oscillator 9 is too fast and must be slowed down. In this way, the zero crossing of the counter 3, which acts like a clock divider, is regulated in the direction of the rising edge of the reference clock signal. If the counter reading that is found is equal to zero, the PLL has locked on, i.e. the high-frequency clock signal generated and the reference clock signal are phase-synchronous.

As mentioned in the introduction, one disadvantage of the digital solution, as can be seen from the simulation in FIG. 3, is that the PLL undergoes transition into a so-called "limit cycle" with variance of the clock signal as "jitter".

The above-indicated limitation of the accuracy is cancelled by the invention's augmentation of the existing phase-locked loop (PLL) by the analog phase detector (2, APD) (see FIG. 4). If the digital phase-locked loop has regulated the two clock edges in a synchronous manner to an extent such that the phase error applied to the code converter is zero, a lock detection activates the additional analog phase detector APD 2 via a line "ana_mode" (also see FIG. 5). Said analog phase detector regulates in a continuously variable manner until both clock edges are fully synchronous. In this case, by generating a so-called "double zero" around which regulation is effected, the code converter 4 ensures that the APD 2 actually remains activated once it has been so activated. Only in the event of relatively large phase differences is the analog phase detector 2 deactivated, and renewed digital coarse regulation takes place.

Further comments with respect to the figures are, specifically:

In FIG. 2, the profiles of the reference clock signal REF-CLK are plotted against the values of the counter 3. The illustration on the left-hand side shows an oscillator DCXO 9 that is too slow. It should be accelerated, i.e. the capacitance charge (CAP LOAD) should be reduced. The middle illustration shows a DCXO 9 in synchronization with REF-CLK. The speed should be maintained, i.e. no change in capacitance (CAPS). The illustration on the right-hand side illustrates a DCXO 9 that is too fast. The capacitance charge should be increased.

Owing to the inherent "quantization error", the PLL will jump between −1, 0 and +1, and in the opposite order.

In the top and bottom graphs, FIG. 3 uses simulation results to show how a digital phase detector 1, DPD operates and the jitter is manifested as an oscillation. The counting frequency or the counting time is plotted on the abscissa and the regulating amplitude is plotted on the ordinate. Thus, the result of the digital phase detector DDP 1 is illustrated at point 20, whose result fluctuates between −1, 0 and +1. The other two curves show the profile of the output signal of the PI filter 10 and of the signal FCTRL of the oscillator control DCXO-control 9. This quantized phase error effects a slow jitter in the difference between clock signal CLX and reference clock signal REF-CLK, illustrated in the bottom part of FIG. 3 by the curve connected to 22 by the arrow, and also a last jitter in the clock signal CLK at 21. In this case, V denotes the difference and Hz correspondingly denotes the frequency.

FIG. 4 illustrates the operation of the analog phase detector 2 added according to the invention. According to the block diagram, the clock frequency from the oscillator 9 is applied to one input of the analog phase detector 2 and the reference clock signal of 8 kHz is applied to the other input. The counter result and the same 8 kHz reference clock signal are fed into the input of the digital phase detector, whose output is connected to the input of the code converter 4. From the code converter 4, a line "ana_mode" passes to a third input of the analog phase detector 2. A signal for reducing the speed of the oscillator 9 then leaves the analog phase detector 2.

The illustration of the phase relationships shows, in the first graph, the clock signal DCXO CLK leading the reference clock signal REF CLK. Acceleration of the DCXO 9 is required in this case. In the second graph, the clock signal DCXO CLK lags behind the clock signal REF CLK, with the result that the DCXO 9 must be slowed down. Thus, the two clock edges are brought to coincidence according to the invention.

FIG. 5 shows how the time difference in ns between the 8 kHz input clock signal and the 8 kHz output clock signal is manifested, and where the analog phase detector 2 joins in, whereupon the phase difference between the two clock signals is reduced to approximately 0 ns. Abscissa and ordinate are graduated in accordance with FIG. 3. The time difference between the output clock signal CLK of the oscillator 9 and the reference clock signal REF-CLK is illustrated in 22, while the analog phase detector APD 2 locks on. Likewise, the difference between the clock signals is regulated to 0 in 24. The scaling of the frequency has been omitted in FIG. 5.

What is claimed is:

1. An electronic phase-locked loop for the jitter-attenuated generation of an output clock signal which is phase-synchronous with respect to a reference clock signal, the phased lock loop comprising:

a digitally controllable oscillator with, a drive circuit connected to said digitally controllable oscillator for digitally setting the output clock signal of the digitally controllable oscillator so that a phase error between the output clock signal and a reference clock signal, is zero, a digital phase detector comparing the output clock signal of the oscillator with the reference clock signal, an analog phase detector, a lock detection circuit connected to said digital phase detector and said analog phase detector for avoiding a phase quantization error, wherein the lock detection circuit activates the analog phase detector to run simultaneously with said digital phase detector if the phase error is zero, the activated analog phase detector regulating the output clock signal of the digitally controllable oscillator in a continuously variable manner until the respective clock signal edges of the output clock signal and of the reference clock signal are fully synchronous, the lock detection circuit deactivating the analog phase detector and continuously checking and regulating the digital phase detector until the phase error between the output clock signal and the reference clock signal does not exceed a specific phase error.

2. The electronic phase-locked loop as claimed in claim 1, further including a PI filter with an integral regulation, a linear regulation and an addition and amplifier stage, which is driven by the analog phase detector.

* * * * *